US008644030B2

(12) United States Patent
Gibbons et al.

(10) Patent No.: US 8,644,030 B2
(45) Date of Patent: Feb. 4, 2014

(54) COMPUTER MODULES WITH SMALL THICKNESSES AND ASSOCIATED METHODS OF MANUFACTURING

(75) Inventors: Kevin Gibbons, Boise, ID (US); Tracy V. Reynolds, Boise, ID (US); David J. Corisis, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 636 days.

(21) Appl. No.: 12/353,773

(22) Filed: Jan. 14, 2009

(65) Prior Publication Data

US 2010/0177490 A1 Jul. 15, 2010

(51) Int. Cl.
*H05K 1/18* (2006.01)
*H01L 25/065* (2006.01)

(52) U.S. Cl.
CPC .................................. *H01L 25/0657* (2013.01)
USPC ........................................... 361/764; 361/760

(58) Field of Classification Search
CPC ........................... H01L 25/0657; H01L 25/105
USPC ................. 361/760, 761, 764; 174/260, 261; 257/687, 686; 29/830
See application file for complete search history.

(56) References Cited

U.S. PATENT DOCUMENTS

| 5,394,300 | A | 2/1995 | Yoshimura |
| 6,486,549 | B1 | 11/2002 | Chiang et al. |
| 6,545,345 | B1 * | 4/2003 | Glenn et al. .................. 257/676 |
| 6,846,704 | B2 * | 1/2005 | Paek ............................. 438/123 |
| 7,112,875 | B1 | 9/2006 | Miks et al. |
| 7,687,899 | B1 * | 3/2010 | Berry ............................ 257/687 |
| 7,829,990 | B1 * | 11/2010 | Scanlan et al. ................ 257/686 |
| 2001/0015485 | A1 * | 8/2001 | Song et al. .................... 257/679 |
| 2002/0053723 | A1 * | 5/2002 | Matsuura ...................... 257/678 |
| 2005/0207133 | A1 | 9/2005 | Pavier et al. |
| 2006/0108144 | A1 | 5/2006 | Shizuno |
| 2006/0226241 | A1 | 10/2006 | Hsu |
| 2007/0215380 | A1 | 9/2007 | Shibamoto |
| 2008/0197479 | A1 | 8/2008 | Kim et al. |
| 2008/0283992 | A1 * | 11/2008 | Palaniappan et al. ......... 257/686 |

OTHER PUBLICATIONS

International Search Report and Written Opinion dated Mar. 26, 2010 in International Application No. PCT/US2009/068568.
Office Action issued Aug. 16, 2012 in Taiwan Application No. 098146477, 24 pages.

* cited by examiner

*Primary Examiner* — Yuriy Semenenko
(74) *Attorney, Agent, or Firm* — Perkins Coie LLP

(57) ABSTRACT

Computer modules with small thicknesses and associated methods of manufacturing are disclosed. In one embodiment, the computer modules can include a module substrate having a module material and an aperture extending at least partially into the module material. The computer modules can also include a microelectronic package carried by the module substrate. The microelectronic package includes a semiconductor die carried by a package substrate. At least a portion of the semiconductor die extends into the substrate material via the aperture.

12 Claims, 5 Drawing Sheets

COMPUTER MODULES WITH SMALL THICKNESSES AND ASSOCIATED METHODS OF MANUFACTURING

TECHNICAL FIELD

The present disclosure is related to computer modules carrying microelectronic packages with a plurality of semiconductor dies and associated methods of manufacturing.

BACKGROUND

Today's computer systems typically include a motherboard with a plurality of sockets spaced apart from one another for receiving memory modules, network interface cards, video cards, and/or other suitable computer modules. Such computer modules can include a printed circuit board that carries one or more microelectronic packages on a surface of the printed circuit board. The microelectronic packages typically include a substrate carrying one or more semiconductor dies encapsulated in a protective covering.

Stacking a plurality of dies in the microelectronic packages is a technique for increasing the processing power of the computer modules. However, stacking the dies also increases the thickness of the computer modules by increasing the extension of the microelectronic packages from the surface of the printed circuit board. As a result, the limited spacing between adjacent sockets may be insufficient for accommodating a large number of stacked dies in the microelectronic packages.

DETAILED DESCRIPTION

Specific details of several embodiments of the disclosure are described below with reference to computer modules with small thicknesses and associated methods of manufacturing. The computer modules can carry at least one microelectronic package having a plurality of stacked dies. Typical microelectronic packages include microelectronic circuits or components, thin-film recording heads, data storage elements, microfluidic devices, and other components manufactured on microelectronic substrates. Micromachines and micromechanical devices are included within this definition because they are manufactured using technology similar to that used in the fabrication of integrated circuits. Microelectronic substrates can include semiconductor pieces (e.g., doped silicon wafers or gallium arsenide wafers), non-conductive pieces (e.g., various ceramic substrates), or conductive pieces. A person skilled in the relevant art will also understand that the disclosure may have additional embodiments, and that the disclosure may be practiced without several of the details of the embodiments described below with reference to FIGS. 1-5.

Figure 1:
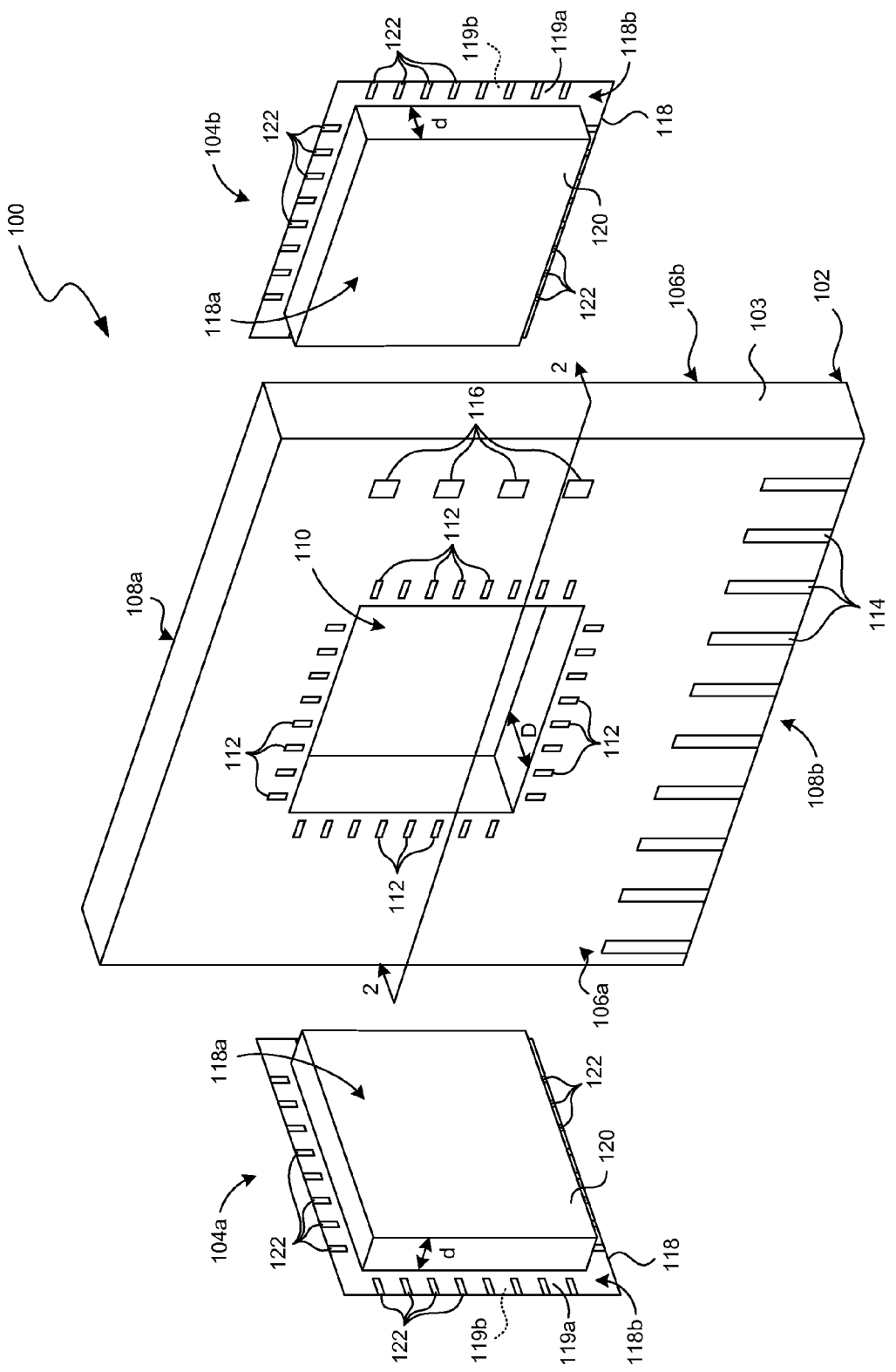
FIG. 1 is an exploded perspective view of a computer module in accordance with embodiments of the disclosure.

FIG. 1 is an exploded perspective view of a computer module 100 in accordance with embodiments of the disclosure. As shown in FIG. 1, the computer module 100 can include a module substrate 102 carrying a first microelectronic package 104a and a second microelectronic package 104b (collectively referred to as microelectronic packages 104). As shown in FIG. 1, the module substrate 102 can include a substrate material 103 having an aperture 110, a plurality of bond sites 112 proximate to the aperture 110, a plurality of contact pads 114 for electrically coupling with a computer socket (not shown), and a plurality of optional supporting electronic components 116 (e.g., resistors, capacitors, diodes, etc.).

In certain embodiments, the substrate material 103 can include a printed circuit board that has a first surface 106a opposite a second surface 106b and a first edge 108a opposite a second edge 108b. The first and second edges 108a and 108b extend between the first and second surfaces 106a and 106b. In the illustrated embodiment, the substrate material 103 includes a sheet-like structure with a generally rectangular shape. In other embodiments, the substrate material 103 can include other types of structure with other desired shapes. Even though the substrate material 103 is shown in FIG. 1 as a single layer of material, in certain embodiments, the substrate material 103 can also include a plurality of conductive and/or non-conductive layers laminated and/or otherwise combined with one another.

The aperture 110 can be shaped and sized to accommodate at least a portion of the microelectronic packages 104. In the illustrated embodiment, the aperture 110 has a generally rectangular cross-section and extends between the first and second surfaces 106a and 106b of the substrate material 103 at a depth D. As a result, the depth D of the aperture 110 generally equals to the thickness of the module substrate 102. In other embodiments, the aperture 110 can have a stepped cross-section, a curved cross-section, a partially curved cross-section, and/or other suitable cross-sectional geometries corresponding to the geometry of the microelectronic packages 104. In yet further embodiments, the aperture 110 may extend only partially between the first and second surfaces 106a and 106b with a depth that is less than D. The aperture 110 may be formed by cutting, punching, etching, and/or other suitable techniques for removing a portion of the substrate material 103.

The microelectronic packages 104 can include a package substrate 118 carrying one or more semiconductor dies 130 (not shown in FIG. 1) encapsulated in an encapsulant 120. As shown in FIG. 1, the package substrate 118 can include a first surface 119a generally facing the module substrate 102 and a second surface 119b opposite the first surface 119a. The first surface 119a includes a peripheral portion 118b that extends laterally from a central portion 118a. The central portion 118a can generally correspond to the semiconductor dies 130 encapsulated in the encapsulant 120. The encapsulant 120 with the encapsulated semiconductor dies 130 can extend from the first surface 119a for a height d. The peripheral portion 118b can carry a plurality of contact pads 122 in electrical communication with the semiconductor dies 130. In the illustrated embodiment, the microelectronic packages 104 are generally similar in structure and in function. In other embodiments, the microelectronic packages 104 can have different structure and/or function. In further embodiments, one of the microelectronic packages 104 may be omitted, as described in more detail below with reference to FIGS. 4 and 5.

In certain embodiments, the depth D of the aperture 110 can be larger than twice the height d of the encapsulant 120 with the encapsulated semiconductor dies 130 as follows:

$$D \geq 2d$$

As a result, the encapsulated semiconductor dies 130 of both the microelectronic packages 104 can be completely inside the aperture 110 of the module substrate 102. In other embodiments, the depth D of the aperture 110 can be larger than the height d of the encapsulant 120 with the encapsulated semiconductor dies 130 but less than twice the height d as follows:

$$2d > D \geq d$$

As a result, in certain embodiments, the encapsulated semiconductor dies 130 of both the microelectronic packages 104 can be partially inside the aperture 110. In other embodiments, the encapsulated semiconductor dies 130 of one microelectronic package 104 may be substantially inside the aperture 110, and those of the other microelectronic package 104 may be only partially inside the aperture 110. In further embodiments, the depth D of the aperture 110 can be less than the height d of the encapsulant 120 with the encapsulated semiconductor dies 130 as follows:

$$D < d$$

As a result, the encapsulated semiconductor dies 130 of the microelectronic packages 104 may be partially inside the aperture 110.

During assembly, a plurality of electric couplers 124 (e.g., solder bumps, gold bumps, etc., not shown in FIG. 1) can be disposed onto the individual bond sites 112 and/or the contact pads 122. The microelectronic packages 104 can then be positioned relative to the module substrate 102 by (1) at least partially inserting the encapsulated semiconductor dies 130 into the aperture 110; and (2) aligning the individual contact pads 122 with the corresponding bond sites 112 on the module substrate 102. Subsequently, the electric couplers 124 may be reflowed and/or otherwise processed to electrically couple the bond sites 112 of the module substrate 102 with the corresponding contact pads 122.

Several embodiments of the computer module 100 can have a reduced thickness when compared to conventional computer modules. By at least partially inserting the microelectronic packages 104 into the aperture 110 of the module substrate 102, the microelectronic packages 104 can have a reduced height from the first and/or second surfaces 106a and 106b of the module substrate 102. Accordingly, the microelectronic packages 104 may incorporate a larger number of stacked semiconductor dies 130 with a reduced impact on the thickness of the computer module 100 when compared to conventional computer modules.

Even though the computer module 100 is shown in FIG. 1 as having one aperture 110, in other embodiments, the computer module 100 can have two, three, four, or any other desired number of apertures 110 to accommodate corresponding microelectronic packages 104. In certain embodiments, some of the apertures 110 may have different shape, size, and/or other characteristics than the other apertures 110. In other embodiments, all of the apertures 110 may be generally identical to one another. In further embodiments, the microelectronic packages 104 may be electrically coupled to the module substrate 102 using wirebonds, leadframes, and/or other suitable techniques.

Figure 2:
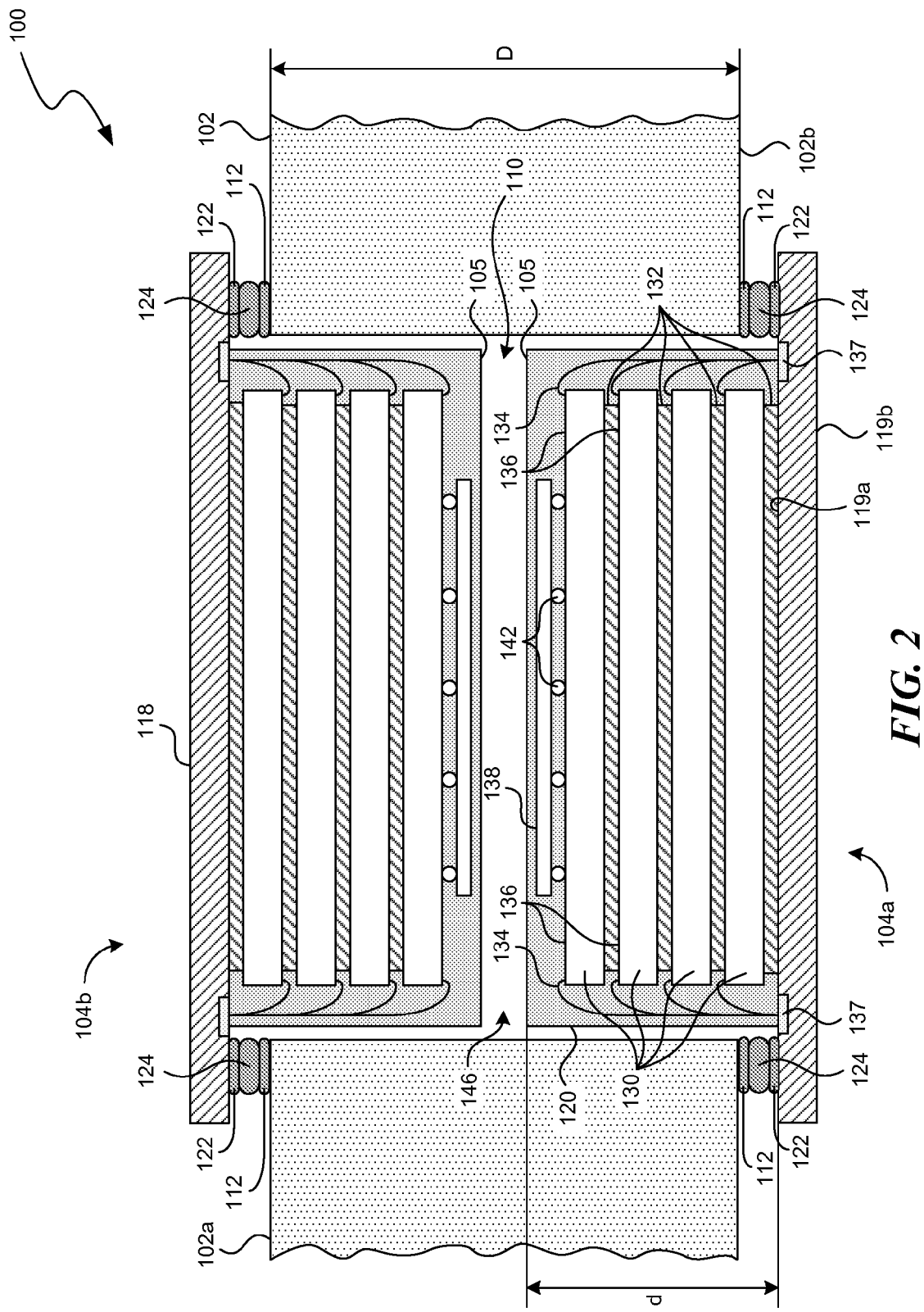
FIG. 2 is a cross-sectional view of the computer module in FIG. 1 as assembled in accordance with an embodiment of the disclosure.

FIGS. 2-5 are cross-sectional views of the computer module 100 in FIG. 1 as assembled in accordance with several embodiments of the disclosure. As shown in FIG. 2, the computer module 100 includes the microelectronic packages 104 coupled to a first side 102a and a second side 102b of the module substrate 102 with a plurality of electric couplers 124. The electric couplers 124 can include solder balls, solder bumps, gold bumps, and/or other suitable conductive couplers. The microelectronic packages 104 can include a plurality of semiconductor dies 130 attached to the package substrate 118 and to one another with an adhesive layer 132 in a stacked arrangement. A plurality of wirebonds 134 electrically couple bond sites 136 of the individual semiconductor dies 130 to corresponding terminals 137 on the package substrate 118. The semiconductor dies 130 can include DRAM, VRAM, FPRAM, and/or other suitable types of semiconductor dies. Even though four semiconductor dies 130 are shown for illustration purposes, the microelectronic packages 104 may include one, two, three, five, or any other desired number of semiconductor dies 130. In other embodiments, the plurality of semiconductor dies 130 may be coupled to the package substrate 118 and/or to one another in a flip-chip arrangement and/or other suitable arrangements.

Figure 3:
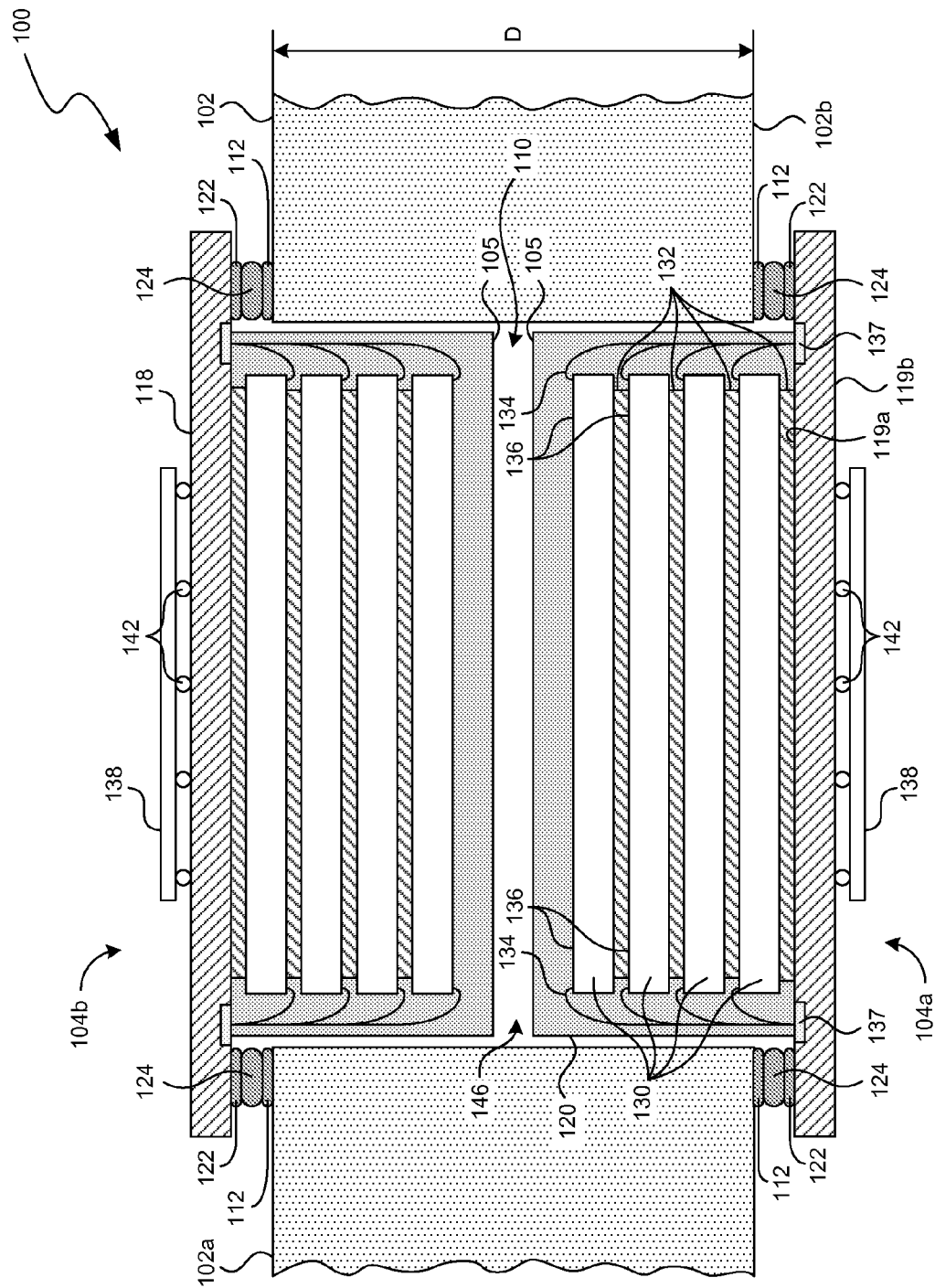
FIG. 3 is a cross-sectional view of the computer module in FIG. 1 as assembled in accordance with another embodiment of the disclosure.

In certain embodiments, the microelectronic packages 104 individually include a processor die 138 encapsulated in the encapsulant 120. In the illustrated embodiment, the processor die 138 is electrically coupled to one of the semiconductor dies 130 with a plurality of conductive couplers 142 (e.g., solder balls). In other embodiments, the processor die 138 may be coupled to the second surface 119b of the package substrate 118 as shown in FIG. 3. In further embodiments, the processor die 138 may be omitted.

In the embodiment shown in FIG. 2, the depth D of the aperture 110 is greater than twice the distance d of the encapsulant 120 and the encapsulated semiconductor dies 130. The semiconductor dies 130, the processor dies 138, and the encapsulant 120 of the microelectronic packages 104 are substantially disposed inside the aperture 110 in a face-to-face configuration. Even though a gap 146 is shown in FIGS. 2 and 3 between the microelectronic packages 104, in certain embodiments, top surfaces 105 of the microelectronic packages 104 may abut each other.

Figure 4:
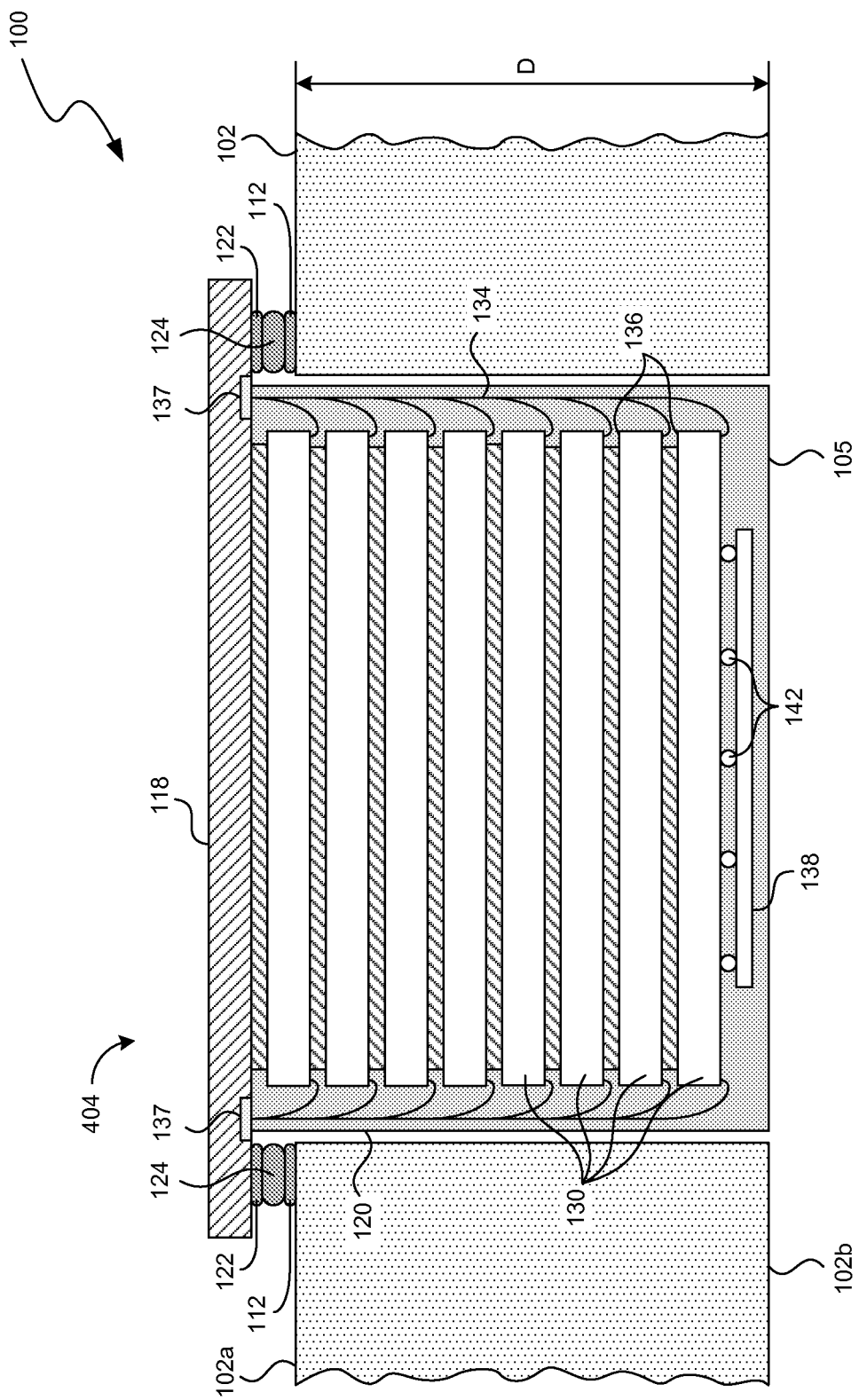
FIG. 4 is a cross-sectional view of the computer module in FIG. 1 as assembled in accordance with yet another embodiment of the disclosure.

In another embodiment, as shown in FIG. 4, the computer module 100 may include only one microelectronic package 404 that substantially occupies the entire space in the aperture 110. The microelectronic package 404 can be generally similar to the microelectronic packages 104 of FIG. 2 except that the microelectronic package 404 can include more semiconductor dies 130 than the microelectronic packages 104 of FIG. 2. In the illustrated embodiment, the top surface 105 of the microelectronic package 404 is generally flush with the second side 102b of the module substrate 102. In other embodiments, the top surface 105 of the microelectronic package 404 can be recessed from the second side 102b of the module substrate 102. In further embodiments, the top surface 105 can extend beyond the second side 102b of the module substrate 102. Even though the microelectronic package 404 is shown to include eight semiconductor dies 130, in other embodiments, the microelectronic package 404 can include any desired number of semiconductor dies 130. In further embodiments, the microelectronic package 404 can include the processor die 138 electrically coupled to the second surface 119b of the package substrate 118 generally similar to that shown in FIG. 3.

Figure 5:
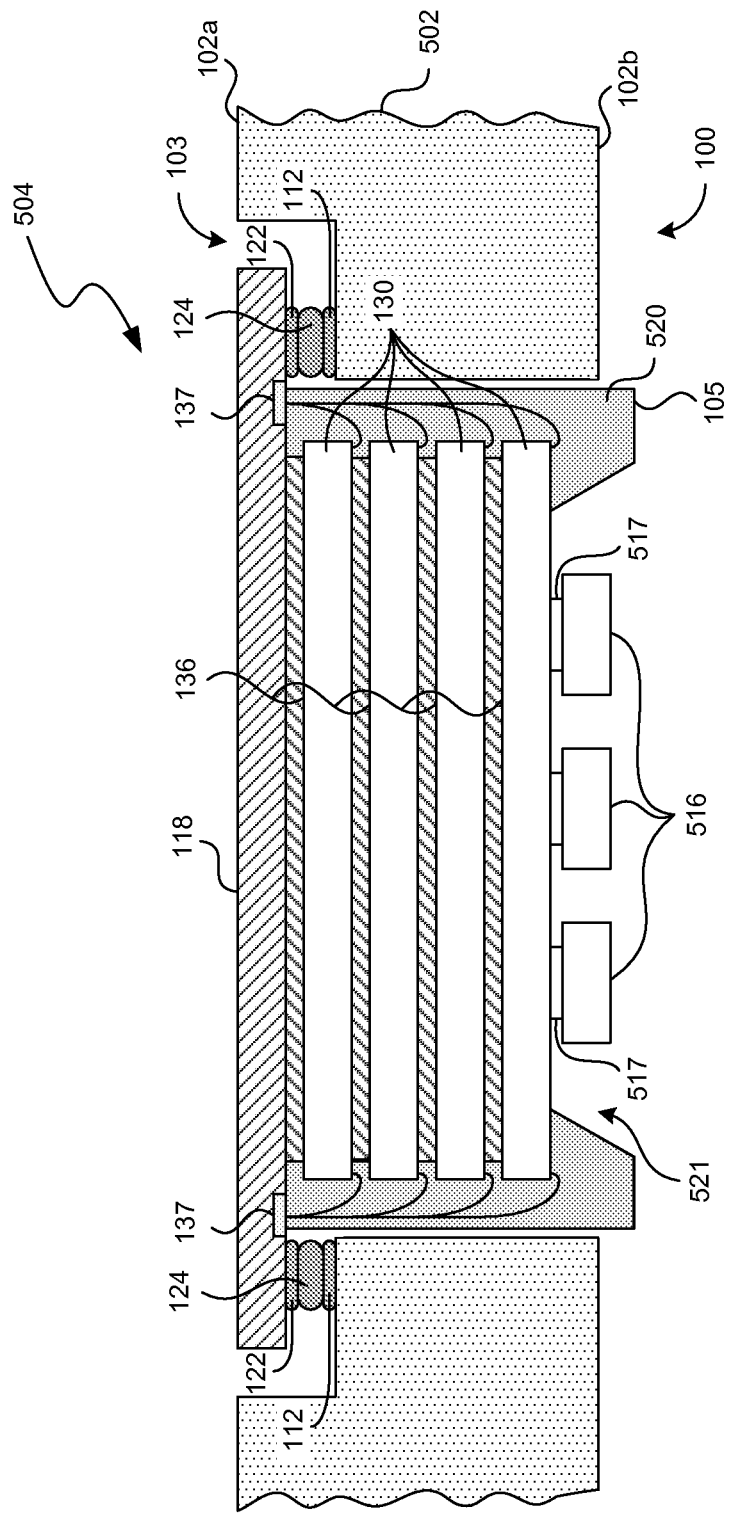
FIG. 5 is a cross-sectional view of the computer module in FIG. 1 as assembled in accordance with a further embodiment of the disclosure.

In further embodiments, as shown in FIG. 5, the computer module 100 can include a microelectronic package 504 electrically coupled to a module substrate 502. The module substrate 502 can be generally similar in structure and in function as the module substrate 102 shown in FIGS. 1-4. However, the module substrate 502 can include a recess 103 at the first side 102a and the bond sites 112 disposed in the recess 103. In the illustrated embodiment, the recess 103 is sized and shaped to receive the package substrate 118 such that the second surface 119b of the package substrate 118 is generally flush with the first side 102a of the module substrate 502. In other embodiments, the recess 103 may be sized and shaped such that the package substrate 118 is recessed from or extending beyond the first side 102a.

As shown in FIG. 5, the microelectronic package 504 can include a plurality of semiconductor dies 130 encapsulated in an encapsulant 520 having an opening 521. The microelectronic package 504 can also include a plurality of electronic components 516 electrically coupled to the semiconductor die 130 through the opening 521 with conductive couplers 517 (e.g., solder balls). The electronic components 516 can include resistors, capacitors, and/or other suitable electronic components configured for signal/power filtering, power rectifying, and/or other signal or power processing functions. Without being bound by theory, it is believed that the short distance between the semiconductor dies 130 and the electronic components 516 can improve the quality of signal and/or power processing by at least partially reducing transmission interference.

Even though the module substrate 502 is shown to have the recess 103 on the first side 102a, in other embodiments, the module substrate 502 may include the recess 103 on the second side 102b. In further embodiments, the module substrate 502 may include the recess 103 on the first side 102a and another recess (not shown) on the second side 102b. In yet further embodiments, the recess 103 may be omitted.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

We claim:

1. A computer module, comprising:
a printed circuit board having a first outermost surface, a second outermost surface opposite the first outermost surface, and an aperture extending between the first and second outermost surfaces, the printed circuit board including
a first plurality of bond sites proximate to the aperture and carried by the first outermost surface,
and a second plurality of bond sites proximate to the aperture and carried by the second outermost surface; and
a first microelectronic package having a first plurality of semiconductor dies, a first processor die and a first package substrate carrying the first plurality of semiconductor dies, the first package substrate having a first side generally facing and extending over the first outermost surface of the printed circuit board, a second side opposite the first side, and a plurality of contact pads individually aligned with the first plurality of bond sites of the printed circuit board, the first plurality of semiconductor dies and the first processor die being in a stacked arrangement on the first side of the first package substrate, wherein all of the first plurality of semiconductor dies supported by the first package substrate are supported at the first side of the first package substrate, wherein the first plurality of semiconductor dies has a proximate side facing the first package substrate and a distal side facing away from the proximate side, wherein the first processor die is attached to the distal side of the first plurality of semiconductor dies, wherein at least a portion of each of the first plurality of semiconductor dies and the first processor die are inside the aperture, and wherein the first plurality of semiconductor dies and the first processor die are generally aligned in a stacked directions;
a first encapsulant encapsulating the first plurality of semiconductor dies and the first processor die, wherein the first encapsulant is substantially completely inside the aperture of the printed circuit board;
a second microelectronic package having a second plurality of semiconductor dies, a second processor die and a second package substrate carrying the second plurality of semiconductor dies, the second package substrate having a first side generally facing and extending over the second outermost surface of the printed circuit board, a second side opposite the first side, and a plurality of contact pads individually aligned with the second plurality of bond sites of the printed circuit board, the second plurality of semiconductor dies and the second processor die being in a stacked arrangement on the first side of the second package substrate, wherein all of the second plurality of semiconductor dies supported by the second package substrate are supported at the first side of the second package substrate, wherein the second plurality of semiconductor dies has a proximal side facing the second package substrate and a distal side facing away from the proximal side, wherein the second processor die is attached to the distal side of the second plurality of semiconductor dies, wherein at least a portion of each of the second plurality of semiconductor dies and the second processor die are inside the aperture, and wherein the second plurality of semiconductor dies and the second processor die are generally aligned in a stacked direction; and
a second encapsulant encapsulating the second plurality of semiconductor dies and the second processor die, wherein the second encapsulant is substantially completely inside the aperture of the printed circuit board.

2. The computer module of claim 1 wherein the first and second plurality of semiconductor dies and the first and second encapsulants are substantially completely inside the aperture of the printed circuit board with the first and second encapsulants abutting each other such that all of the semiconductor dies carried by the first and second package substrates are positioned between the first side of the first package substrate and the first side of the second package substrate.

3. The computer module of claim 1 wherein the aperture has a cross-sectional dimension larger than that of the encapsulated semiconductor die but smaller than that of the package substrates.

4. The computer module of claim 1 wherein the printed circuit board includes recesses proximate to the aperture, and wherein the first and second plurality of bond sites of the printed circuit board are located in the recesses.

5. The computer module of claim 1 wherein the microelectronic package includes at least four semiconductor dies at least substantially within the aperture.

6. The computer module of claim 1 wherein the first and second pluralities of semiconductor dies include at least eight semiconductor dies at least substantially within the aperture.

7. The computer module of claim 1, wherein
the first package substrate is positioned outside the outermost boundary of the printed circuit board; and
the second package substrate is positioned outside the outermost boundary of the printed circuit board.

8. The computer module of claim 1 wherein the aperture has a substantially uniform width between the first and second outermost surfaces of the printed circuit board.

9. The computer module of claim 1 wherein the aperture has a generally rectangular uniform cross-section.

10. The computer module of claim 1 wherein the plurality of semiconductor dies includes at least four semiconductor dies.

11. The computer module of claim 1 wherein the first processor die is a flip-chip die.

12. The computer module of claim 1 wherein the second processor die is a flip-chip die.

* * * * *

UNITED STATES PATENT AND TRADEMARK OFFICE
CERTIFICATE OF CORRECTION

| | | |
|---|---|---|
| PATENT NO. | : 8,644,030 B2 | Page 1 of 1 |
| APPLICATION NO. | : 12/353773 | |
| DATED | : February 4, 2014 | |
| INVENTOR(S) | : Kevin Gibbons et al. | |

It is certified that error appears in the above-identified patent and that said Letters Patent is hereby corrected as shown below:

In the Claims

In column 5, line 53, In Claim 1, after "surface;" delete "and".

In column 6, line 10, In Claim 1, delete "directions;" and insert -- direction; --, therefor.

Signed and Sealed this
Thirteenth Day of May, 2014

Michelle K. Lee
*Deputy Director of the United States Patent and Trademark Office*